United States Patent [19]

Steele

[11] Patent Number: 5,773,885
[45] Date of Patent: Jun. 30, 1998

[54] THERMALLY RESPONSIVE COMPRESSIVE DIODE ASSEMBLY

[75] Inventor: Roy Burton Steele, Richmond, Ind.

[73] Assignee: General Motors Corporation, Detroit, Mich.

[21] Appl. No.: 656,956

[22] Filed: Jun. 6, 1996

[51] Int. Cl.$^6$ ................................................. H01L 23/10
[52] U.S. Cl. ......................... 257/710; 257/718; 257/724; 257/727; 257/925
[58] Field of Search ................................. 257/658, 706, 257/710, 718, 719, 724, 726, 727, 925; 363/141, 144, 145

[56] References Cited

U.S. PATENT DOCUMENTS 5,302,856  4/1994  Narita et al. ............................ 257/788

OTHER PUBLICATIONS

Training Chart Manual; Delco Remy, Anderson, Indiana; 1962; pp. Chart 13; "Delcotron generator and the charging circuit".

*Primary Examiner*—Minh-Loan Tran
*Attorney, Agent, or Firm*—Vincent A. Cichosz

[57] ABSTRACT

A power rectifier has a diode blank sandwiched between a pair of contacts which apply progressive compressive loads upon the diode blank as the temperature of the diode assembly increases. Preferably, the contacts are formed from dissimilar metals having different thermal expansion characteristics and are operatively coupled such that the thermal expansion differential translates into the desired compressive load characteristic.

8 Claims, 2 Drawing Sheets

THERMALLY RESPONSIVE COMPRESSIVE DIODE ASSEMBLY

BACKGROUND

The present invention is related to diodes generally used for rectification of multi-phase AC voltage to DC voltage. More particularly, the invention is directed toward diodes used in diode bridge assemblies for automotive alternator applications.

Automotive alternators are conventionally three phase machines. Rectification of the three phase voltage generated by such a machine is generally accomplished by what is commonly referred to as a bridge assembly comprising a plurality of diodes and substantial heat sinks in thermal and electrical conduction therewith. Such bridge assemblies are typically packaged within the alternator housing and subjected to substantial heat dissipated from the machine in addition to the heat generated through the diodes themselves from ohmic losses. Automotive alternators are required to deliver increasingly higher levels of current which further increases the amount of heat dissipated from the machine and diodes. Additionally, the automotive alternator is in a relatively harsh thermal environment being underhood in close proximity to the engine.

The diodes used in such bridge assemblies are generally wafer-like and part of a power diode assembly. Two well known type of power diode assemblies are shown in FIGS. 1 and 2. The figures have many of the features exaggerated for clarity. In FIG. 1, a first type of power diode assembly 10 is shown which is generally employed in light duty automotive applications such as passenger cars. Such power diode assembly includes a semiconductor rectifier blank 21 (hereafter diode blank), metallic contact members 17 and 25 formed of nickel plated copper and solder layers 19 and 23 joining the metallic contact members to opposite faces of the diode blank 21. Each one of the faces is one of the anode or cathode of the diode. The power diode assembly 10 is ultrasonically welded or soldered 27 to a heat sink 29 at one of the anode or cathode in accordance with the desired orientation. The other of the anode or cathode of power diode assembly 10 is soldered 13 to a copper conductor 11. A coating of a material 15 such as silicone rubber completely encapsulates the power diode assembly to prevent contamination from such things as road salts. In a complete light duty bridge assembly, for example as shown in U.S. Pat. No. 4,606,000 assigned to General Motors Corporation, six such power diode assemblies are used per bridge assembly; three on a first heat sink and thereon a second electrically separate heat sink. Each heat sink is further effective as a DC output terminal.

In FIG. 2, a second type of power diode assembly 32 is shown as part of an encased diode assembly 30 which is generally employed in heavy duty automotive applications such as commercial vehicles. Such power diode assembly includes semiconductor rectifier or diode blank 41, and metallic contact member 43 formed of copper or nickel. Contact member 43 is joined to one face of the diode blank 41 such as by soldering, and the other face of the diode blank is secured to the bottom of metallic case 39 such as by soldering. The case thereby is one of the anode or cathode terminals depending upon orientation of the diode blank. The other terminal is formed of a conductive lead 45 soldered to the contact member and exiting the case. The lead 45 takes a serpentine shape for relief of stress upon the power diode assembly 32 and couples to a larger external lead 31. A conductive cap 35 mates with the case 39 and is sealed 37 from external contaminants. The lead 31 passes through an aperture in the cap 35, the area therebetween being sealed such as by a glass, epoxy or equivalent material.

Through normal operation, the solder connections of the power diode assemblies experience significant thermal cycles which tend to degrade the quality of the solder joints leading to high resistance joints and consequent high losses as well as complete operable failures.

SUMMARY

Therefore, it is an object of the present invention to improve life cycle attributes of power diode assemblies. More specifically, interface contact integrity of power diode assemblies is improved.

The present invention generally accomplishes such improvements by packaging a diode blank such that normal increases in operating temperatures result in corresponding increases in contact pressures across the diode blank faces. A power diode assembly in accordance with the present invention includes a rectifier blank, a pair of contacts and thermally responsive clamping means effective to progressively compressively load the rectifier blank between the first and second contact means as the temperature of the assembly increases.

In accordance with a preferred embodiment of the invention, the pair of contacts have different temperature dependent rates of thermal expansion and are operatively coupled such that the thermal expansion differential therebetween exerts increasing compressive loads upon the rectifier blank as the assembly temperature increases.

BRIEF DESCRIPTION OF THE DRAWING

The present invention will now be described, by way of example, with reference to the accompanying drawings, in which.

DETAILED DESCRIPTION

Figure 1:
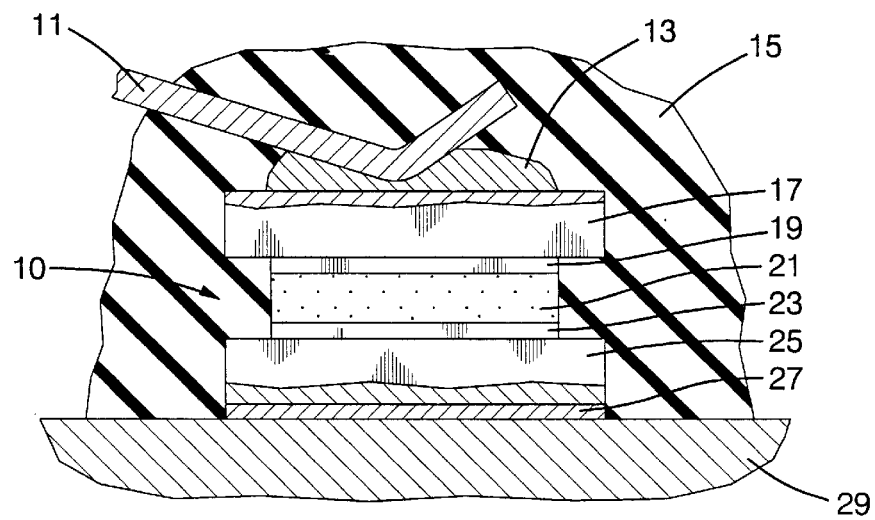
FIG. 1 is a partial sectional schematic view of a prior art diode assembly in a light duty automotive bridge assembly.
Figure 2:
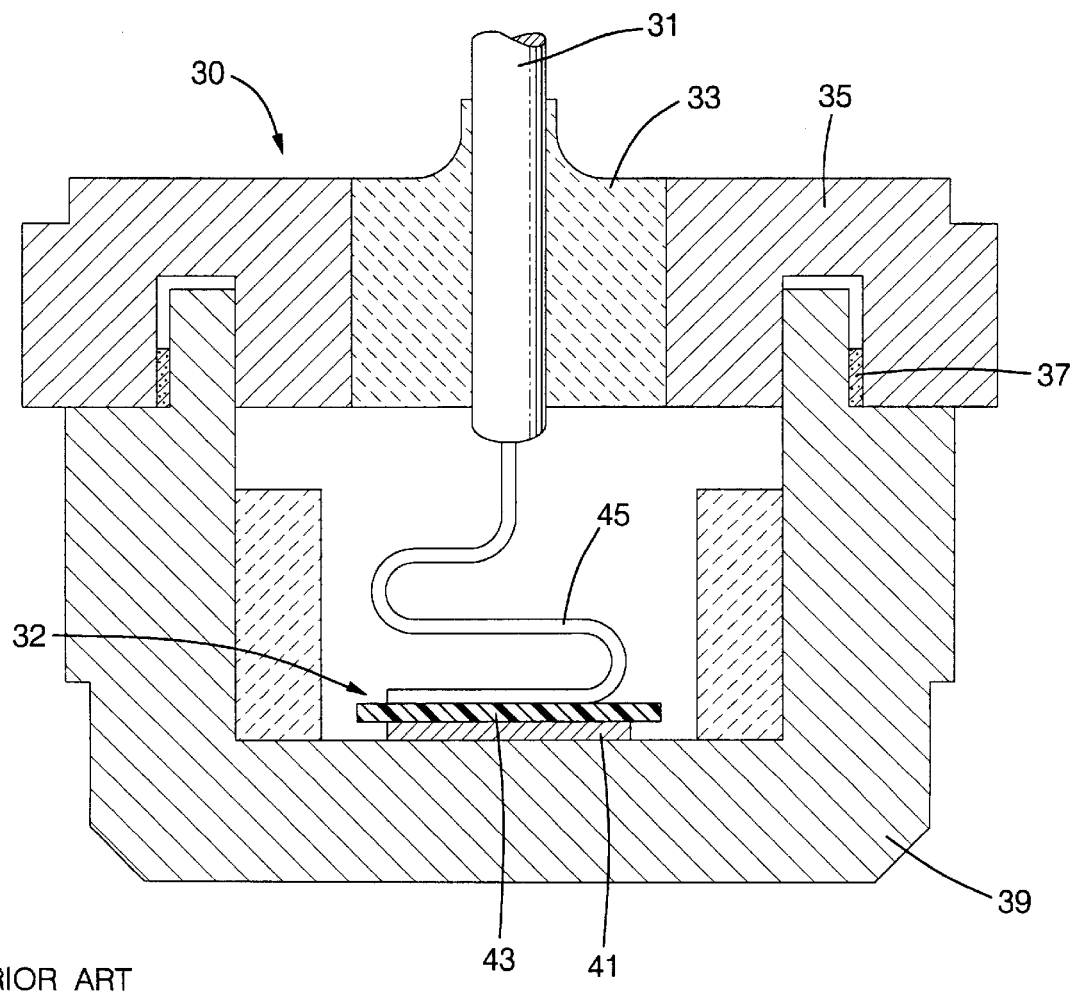
FIG. 2 is a partial sectional schematic view of a heavy duty diode assembly as used in heavy duty automotive bridge assemblies.
Figure 3:
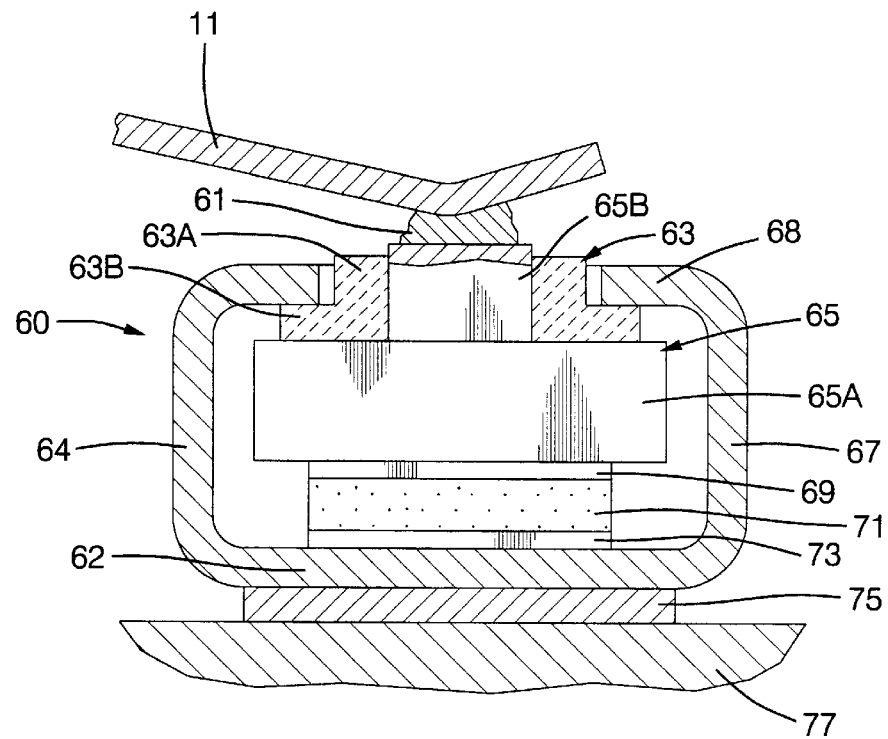
FIG. 3 is a first embodiment of a power diode assembly in accord with the present invention; and, FIG. 4 is a second embodiment of a power diode assembly in accord with the present invention.

With reference to the appended drawings and particularly with reference to FIG. 3, a diode assembly 60 in accordance with the present invention is illustrated. Many features of the diode assembly are exaggerated for clarity. A diode assembly preferably comprises an open ended cylindrical metal can 67 having a base 62 and substantially perpendicular side 64 circumferentially surrounding the diode blank. It is further envisioned that two or more substantially symmetrically distributed extensions oriented substantially perpendicular to the base may alternatively be employed in place of a can structure having a circumferentially continuous side wall as described. Such latter structure may be provided, for example, by a stamping having co-planar base and extensions therefrom, which extensions may be bent into substantial perpendicularity with the base portion. Assuming a sectional view taken through a pair of opposing extensions as described, this latter structure would appear similar to the sectional view illustrated in FIG. 3. Can 67 is preferably formed from steel, and plated with nickel or copper for proper solder adhesion if desired as described at a later point. A diode blank 71 is soldered 73 or compressed onto the inside surface of base 62 of can 67, which base provides electrical contact for the diode blank. The opposite face of diode blank 71 is likewise soldered 69 or compressed onto metallic contact 65 preferably formed of nickel plated copper. In the case of a solderless assembly, it is desirable to deposit a layer of soft metal such as silver or aluminum onto the faces of the diode blank to ensure good electrical contact integrity and to prevent the diode blank from cracking under compression during assembly In the present preferred embodiment, contact 65 has an internal contact portion 65A and a external contact portion 65B. Portion 65A is generally disk-shaped and provides a flange or shoulder around portion 65B. Portion 65B extends above portion 65A and provides a convenient electrical interface for example to a bridge assembly conductor such as copper conductor 11 as illustrated. Surrounding portion 65B is insulator 63 comprising collar 63A and flange 63B and formed of electrically insulative and substantially incompressible material. It is desirable that the collar portion 63A fits snugly about the outer diameter of portion 65B of contact 65. Furthermore, it is important that flange portion 63B bears against the shoulder of portion 65A of contact 65. An exemplary material for ring 63 is a thermoplastic such as polyphenylene sulfide. Alternative geometries may be employed for the contact 65 such as a simple disk. Likewise, alternative insulator geometries such as a simple annulus may be substituted for the specific geometry illustrated. It is generally desirable to dispose the insulator at the perimeter of the contact leaving a central aperture through which external electrical interface can be made. Alternative means for providing such insulator may also include direct deposition upon the contact.

After the diode blank, contact and ring are assembled, side 64 is formed into a lip 68 by rolling or crimping inward against the flange portion 63B of ring 63. Preferably, a compressive load is created between the lip 68 and the base 62 by such operation.

A diode assembly as described may be used in a rectifier bridge assembly of the variety previously described. As such, FIG. 3 further illustrates diode assembly 60 being soldered 75 to heat sink 77. Heat sink 77 further comprises one of the DC output terminals of the bridge rectifier. Copper conductor 11 is likewise soldered 61 to external contact portion 65B.

The exemplary materials chosen for the can 67 and the contact 65 in the present embodiment have different coefficients of thermal expansion ($C_t$). Preferably, copper is used for contact 65 and has a $C_t$ of substantially 16.5 while steel is a preferred material used for the can 67 and has a $C_t$ of substantially 12. It is necessary that the $C_t$ of the contact be greater than the $C_t$ of the can. With this relationship, as the diode assembly 60 heats up, the differential expansion of the contact and can results in increasing the compressive load upon the diode blank. The cooperation between the operatively coupled contacts provides for a thermally responsive clamp upon the diode blank with generally increasing compressive loads for increasing assembly temperatures. Such increasing temperatures are generally the result of internally generated heat. The inventor has demonstrated through experimentation that applying compressive forces to power semiconductor solder interfaces increases the fatigue life thereat.

Figure 4:
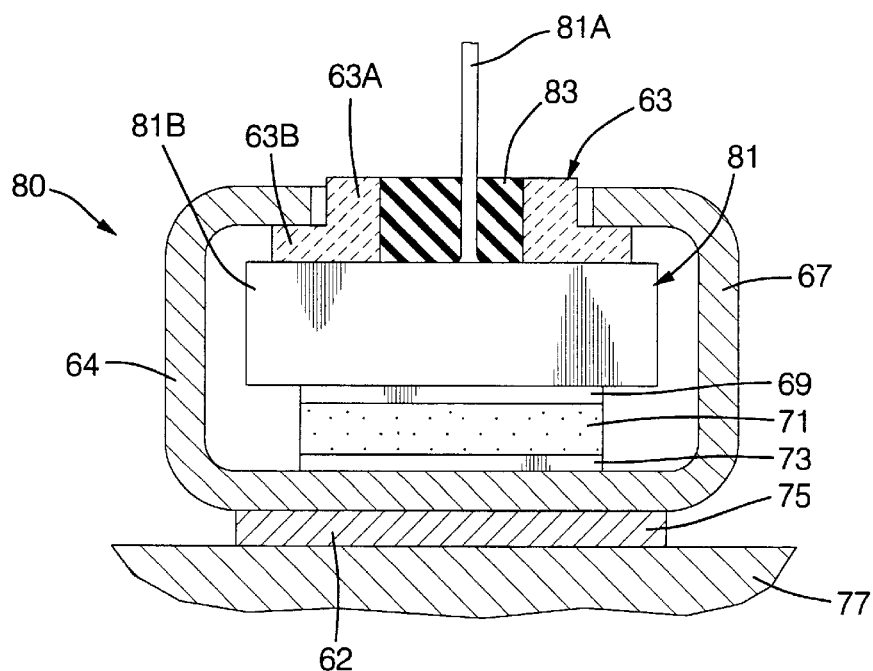

Similarly, the alternative embodiment illustrated in FIG. 4 shows a diode assembly 80 in accordance with the present invention. Many features of the diode assembly are exaggerated for clarity. The diode assembly also comprises a cylindrical metallic can 67 having a base 62 and substantially perpendicular sides 64. A diode blank 71 is soldered 73 or compressed onto one face thereof directly to the inside surface of base 62 of can 67. The opposite face of diode blank 71 is likewise soldered 69 or compressed onto metallic contact 65. The materials used in this embodiment may be the same as those used in the previous embodiment. The contact 81 has geometry similar to that of the contact of the previously described embodiment; that is to say it comprises an internal contact portion 81B and an external contact portion 81A which provides for an electrical lead. Portion 81B provides a major surface against which bears insulator 63. Contact 81 may be fabricated for example as a headed copper part. The remaining features illustrated in FIG. 4 that are labeled similar to items in FIG. 3 may be considered as being substantially equivalent thereto.

The embodiment of the diode assembly illustrated in FIG. 4 is shown soldered to a heat sink/conductor 77 similar to the embodiment shown in FIG. 3. However, it is understood that with this embodiment, the diode assembly 80 may be suitably sized for a retentive press fit into a heat sink/conductor such that the outer surfaces of sides 64 are enclosed and dissipate heat to the surrounding heat sink. One or both of the mating surfaces may be scored or fluted to facilitate a press fit operation.

Although the exemplary embodiments show the diode blank soldered on both sides to either the can or contact, the present invention is equally applicable to a solderless interface of the can and contact to respective faces of the diode blank. The progressive compressive force with temperature increase further insures contact integrity at the electrical interfaces of the diode blank.

It is recognized that any of a variety of arrangements generally effective to translate thermal expansion differentials into compressive clamping forces at the diode blank to contact interfaces are within the scope of the invention as exemplified in certain preferred embodiments detailed herein. While the present invention has been described with respect to certain preferred embodiments, it is envisaged that various alternative implementations will occur to those skilled in the art. Therefore, the embodiments described are intended to be taken by way of example and not of limitation.

I claim:

1. A power rectifier assembly comprising:
   a rectifier blank having opposite anodic and cathodic surfaces;
   first contact means coupled to one of the anodic and cathodic surfaces;
   second contact means coupled to the other one of the anodic and cathodic surfaces; and
   thermally responsive clamping means effective to progressively compressively load the rectifier blank between the first and second contact means as assembly temperature increases, said means including substantially unyieldable means through which the loading is transmitted.

2. A power rectifier assembly as claimed in claim 1 wherein said clamping means comprises said first and second contact means, one of said first and second contact means is characterized by a first thermal expansion coefficient and the other of the first and second contact means is characterized by a second thermal expansion coefficient greater than the first thermal expansion coefficient, said first and second contact means operatively coupled through said substantially unyieldable means such that a thermal expansion differential therebetween exerts increasing compressive loads upon the rectifier blank as the assembly temperature increases.

3. A power rectifier assembly comprising:

a rectifier blank having opposite anodic and cathodic surfaces;

first contact means having substantially opposing inner and outer surfaces and characterized by a first thermal expansion coefficient, the inner surface coupled to one of the anodic and cathodic surfaces of the rectifier blank; and second contact means having a base and side extensions and characterized by a second thermal expansion coefficient, the base portion in communication with the other one of said anodic and cathodic surfaces of the rectifier blank, the side extensions substantially perpendicular to said base portion bypassing the rectifier blank and first contact means in spaced relationship thereto and terminating at ends operatively coupled through substantially unyieldable means to the outer surface of the first contact means, whereby assembly temperature increases results in increasing compressive loading of the rectifier blank between the respective contact means.

4. A power rectifier assembly as claimed in claim 3 wherein said second contact means is generally cup shaped, said side extensions comprising a circumferentially continuous side wall extending from the base, and said ends comprising a circumferential lip operatively coupled to the outer surface of the first contact means.

5. A power rectifier assembly as claimed in claim 3 wherein said second contact means comprises a plurality of extensions symmetrically distributed at outer edges of the base.

6. A power rectifier assembly comprising:

first contact means comprising a first electrically conductive material characterized by a first thermal expansion coefficient, said first contact means including a substantially planar circular base and a substantially cylindrical side wall extending orthogonally in a single direction with respect to the base;

a rectifier blank having anodic and cathodic surfaces, one of said surfaces being in contact with the base of the first contact means in spaced relationship to the cylindrical side wall;

second contact means comprising a second electrically conductive material characterized by a second thermal expansion coefficient greater than the first thermal expansion coefficient, said second contact means including a substantially planar first contact surface in contact with the other of said surfaces of the rectifier blank, and a second contact surface opposite the first contact surface, said second contact means being in spaced relationship to the cylindrical side wall;

a substantially incompressible electrical insulator perimetrically disposed on the second contact surface;

said cylindrical side wall having a lip engaged with the insulator such that assembly temperature increases result in increasing compressive loading of the rectifier blank between the respective contact means.

7. A power rectifier assembly as claimed in claim 6 wherein the rectifier blank is soldered to at least one of the first and second contact means.

8. A power rectifier assembly as claimed in claim 6 wherein the first contact means comprises steel and the second contact means comprises copper.

* * * * *